(12) United States Patent
Ely et al.

(10) Patent No.: US 9,941,581 B2
(45) Date of Patent: Apr. 10, 2018

(54) ANTENNA WINDOW AND ANTENNA PATTERN FOR ELECTRONIC DEVICES AND METHODS OF MANUFACTURING THE SAME

(71) Applicant: Apple Inc., Cupertino, CA (US)

(72) Inventors: Colin M. Ely, Cupertino, CA (US); Christopher D. Prest, San Francisco, CA (US); Lucy E. Browning, San Francisco, CA (US); Stephen B. Lynch, Portola Valley, CA (US); Eric S. Laakmann, Seattle, WA (US); Paul L. Nangeroni, Mountain View, CA (US)

(73) Assignee: Apple Inc., Cupertino, CA (US)

( * ) Notice: Subject to any disclaimer, the term of this patent is extended or adjusted under 35 U.S.C. 154(b) by 205 days.

(21) Appl. No.: 14/945,335

(22) Filed: Nov. 18, 2015

(65) Prior Publication Data

US 2016/0149298 A1 May 26, 2016

Related U.S. Application Data

(63) Continuation of application No. 13/973,939, filed on Aug. 22, 2013, now Pat. No. 9,209,513.
(Continued)

(51) Int. Cl.
*H01Q 1/42* (2006.01)
*C23C 14/16* (2006.01)
(Continued)

(52) U.S. Cl.
CPC ............... *H01Q 1/42* (2013.01); *C23C 14/16* (2013.01); *C23C 14/5853* (2013.01);
(Continued)

(58) Field of Classification Search
CPC .................................. H01Q 1/42; H01Q 1/24
See application file for complete search history.

(56) References Cited

U.S. PATENT DOCUMENTS

| 5,891,815 A | 4/1999 | Dodds et al. |
| 7,983,721 B2 | 7/2011 | Ying et al. |
| (Continued) | | |

FOREIGN PATENT DOCUMENTS

| CN | 1384561 A | 12/2002 |
| CN | 101308266 A | 11/2008 |
| (Continued) | | |

OTHER PUBLICATIONS

Extended Search Report in PCT Application No. 14807441.2 / PCT/US20141041168, dated Dec. 22, 2016 in 9 pages.
(Continued)

*Primary Examiner* — Andrea Lindgren Baltzell
(74) *Attorney, Agent, or Firm* — Kilpatrick Townsend and Stockton, LLP

(57) ABSTRACT

A housing for an electronic device, including an aluminum layer enclosing a volume that includes a radio-frequency (RF) antenna is provided. The housing includes a window aligned with the RF antenna; the window including a non-conductive material filling a cavity in the aluminum layer; and a thin aluminum oxide layer adjacent to the aluminum layer and to the non-conductive material; wherein the non-conductive material and the thin aluminum oxide layer form an RF-transparent path through the window. A housing for an electronic device including an integrated RF-antenna is also provided. A method of manufacturing a housing for an electronic device as described above is provided.

17 Claims, 15 Drawing Sheets

Related U.S. Application Data

(60) Provisional application No. 61/832,760, filed on Jun. 7, 2013.

(51) Int. Cl.

| | |
|---|---|
| *C23C 14/58* | (2006.01) |
| *C23C 16/06* | (2006.01) |
| *C23C 28/00* | (2006.01) |
| *H01Q 1/24* | (2006.01) |

(52) U.S. Cl.
 CPC ............ *C23C 16/06* (2013.01); *C23C 28/322* (2013.01); *C23C 28/345* (2013.01); *H01Q 1/24* (2013.01); *H01Q 1/243* (2013.01)

(56) References Cited

U.S. PATENT DOCUMENTS

| | | | |
|---|---|---|---|
| 8,183,109 B2 | 5/2012 | Izumi et al. | |
| 9,209,513 B2 | 12/2015 | Ely et al. | |
| 2004/0164302 A1 | 8/2004 | Arai et al. | |
| 2006/0183342 A1 | 8/2006 | Bruyns et al. | |
| 2008/0166884 A1 | 7/2008 | Nelson et al. | |
| 2009/0197654 A1 | 8/2009 | Teshima et al. | |
| 2009/0280340 A1 | 11/2009 | Lee et al. | |
| 2010/0103612 A1* | 4/2010 | Weber .................. | H05K 5/0247 361/679.56 |
| 2010/0164818 A1 | 7/2010 | Kusunoki et al. | |
| 2011/0298670 A1 | 12/2011 | Jung et al. | |
| 2011/0317343 A1 | 12/2011 | Shin et al. | |
| 2012/0070691 A1 | 3/2012 | Graf | |
| 2012/0146857 A1* | 6/2012 | Wang .................. | H01Q 1/2258 343/702 |
| 2012/0194998 A1 | 8/2012 | McClure et al. | |
| 2013/0008796 A1* | 1/2013 | Silverman ................ | C25D 7/00 205/50 |
| 2013/0078398 A1 | 3/2013 | Weber | |

FOREIGN PATENT DOCUMENTS

| | | |
|---|---|---|
| HK | 1219177 A1 | 3/2017 |
| WO | 2009014366 A2 | 1/2009 |

OTHER PUBLICATIONS

PCT Application No. PCT/US 2014/041168—International Search Report & Written Opinion dated Sep. 26, 2014.

PCT Application No. PCT/US 2014/041168—International Preliminary Report on Patentability dated Dec. 17, 2015.

Office Action in China U.S. Application No. CN201480032038.5, dated Oct. 30, 2017, 6 pages.

Office Action in China Application No. CN201480032038.5, dated Mar. 22, 2017 in 20 pages.

\* cited by examiner

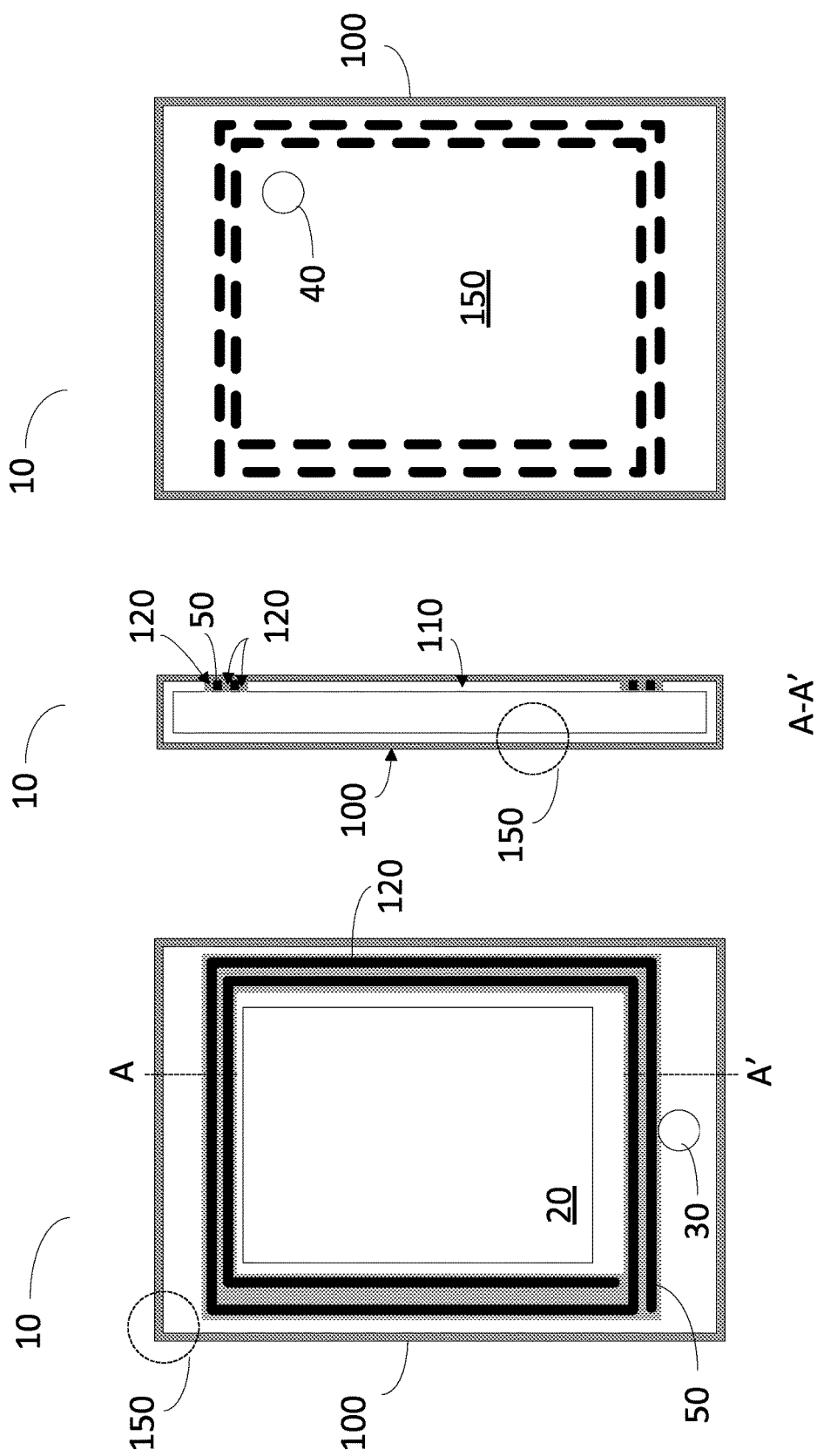

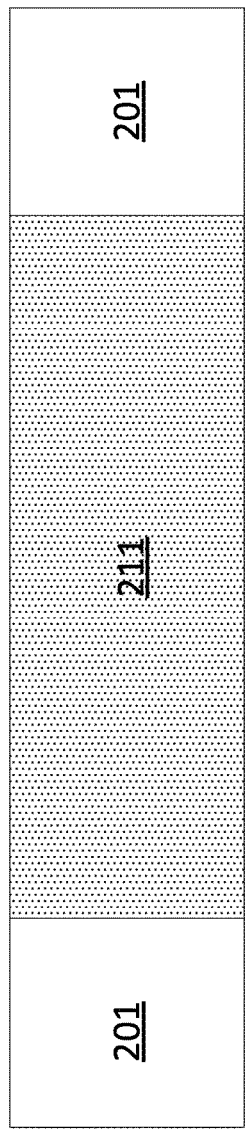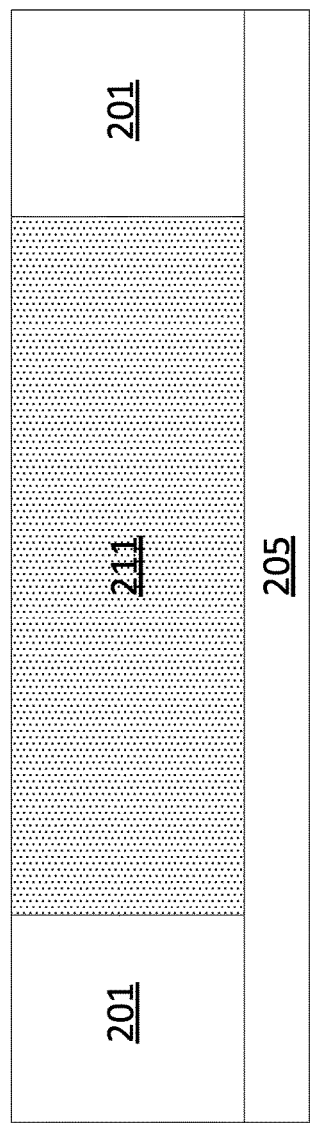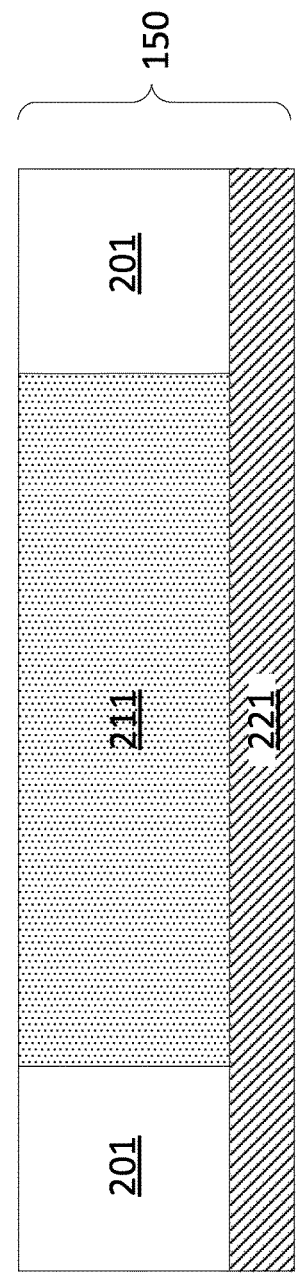

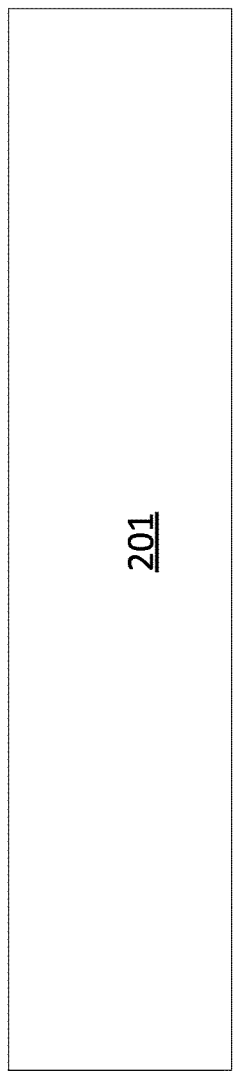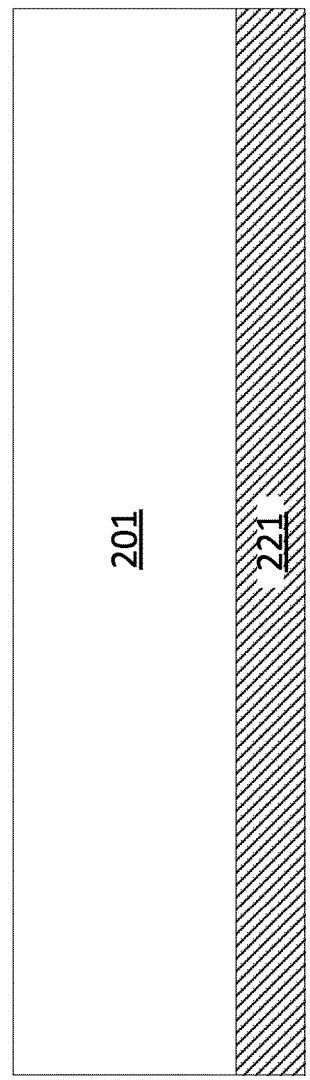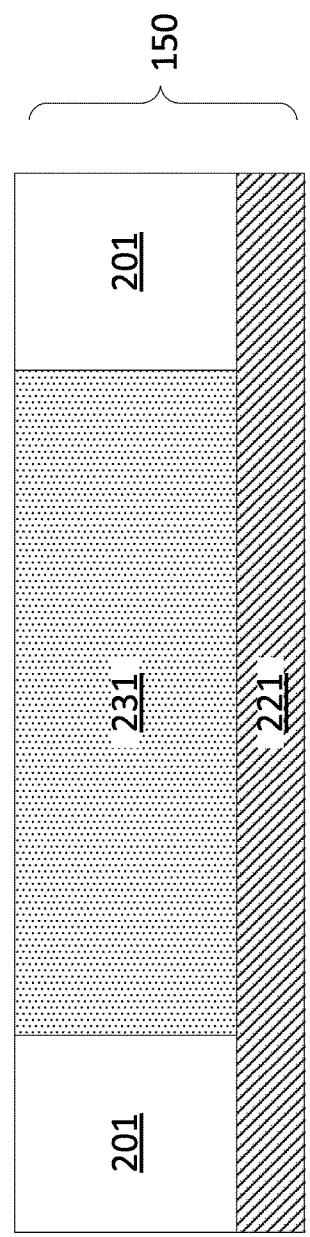

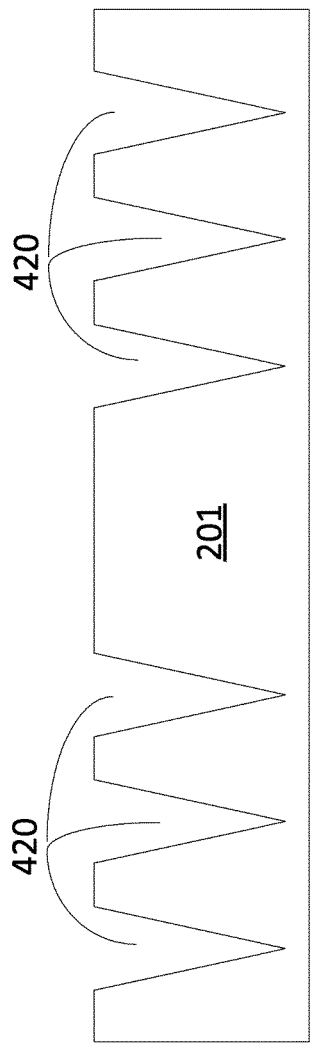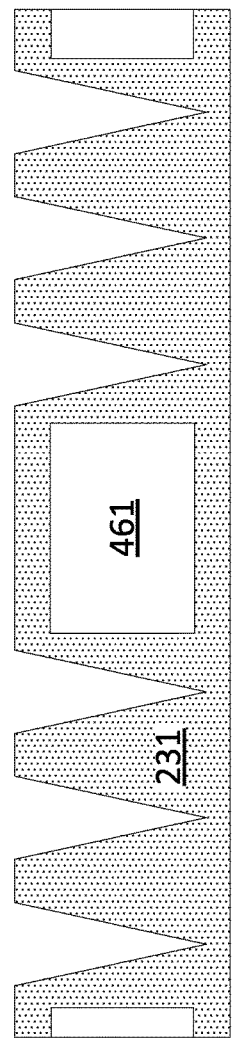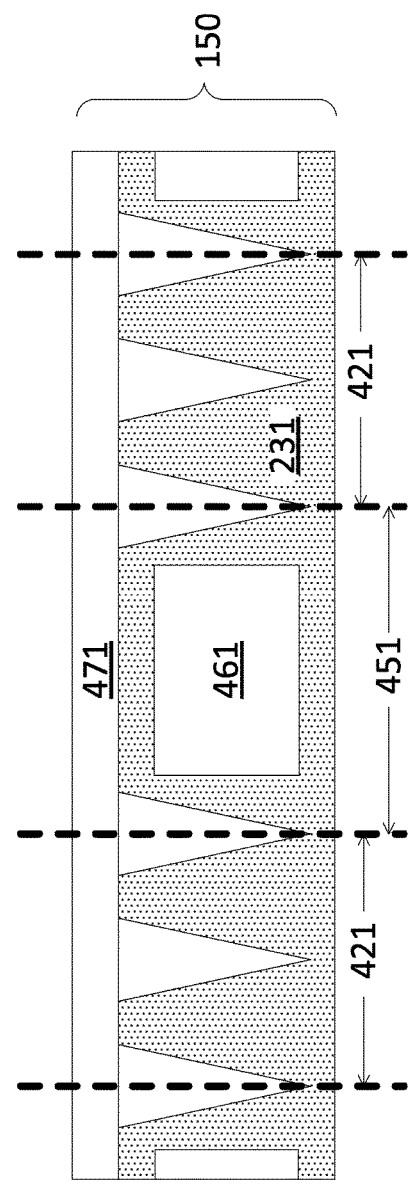

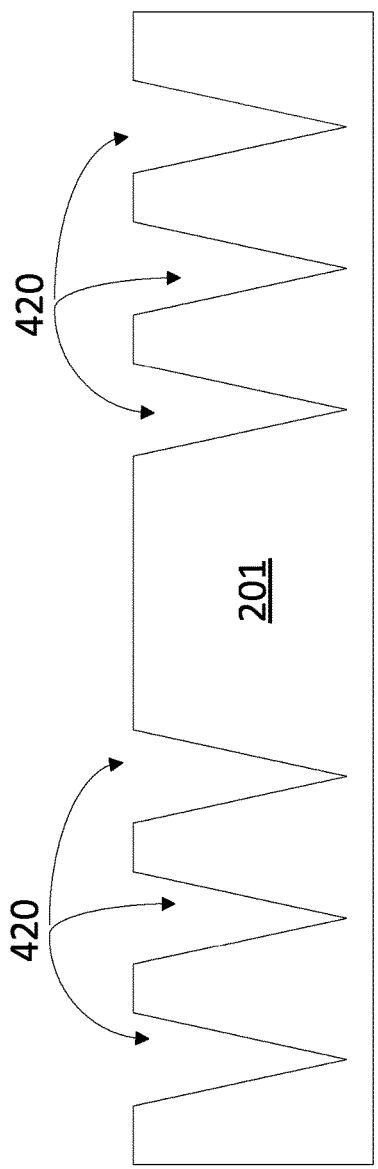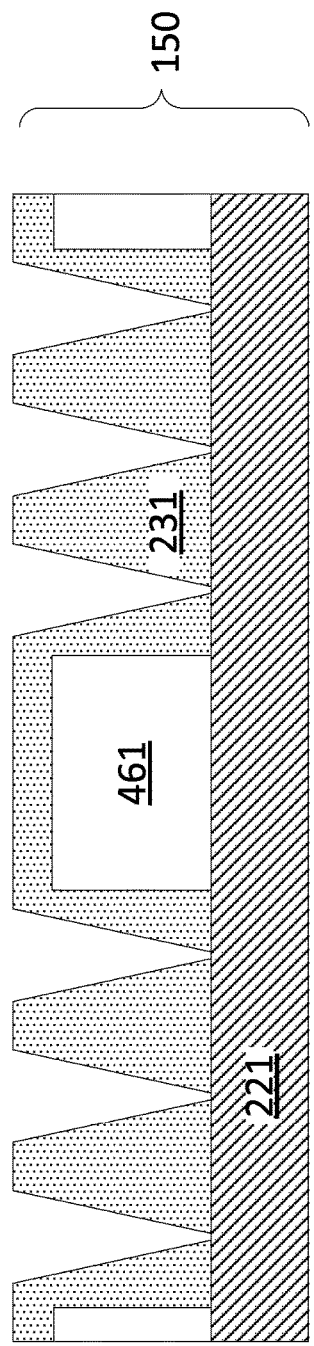
FIG. 5A
FIG. 5B

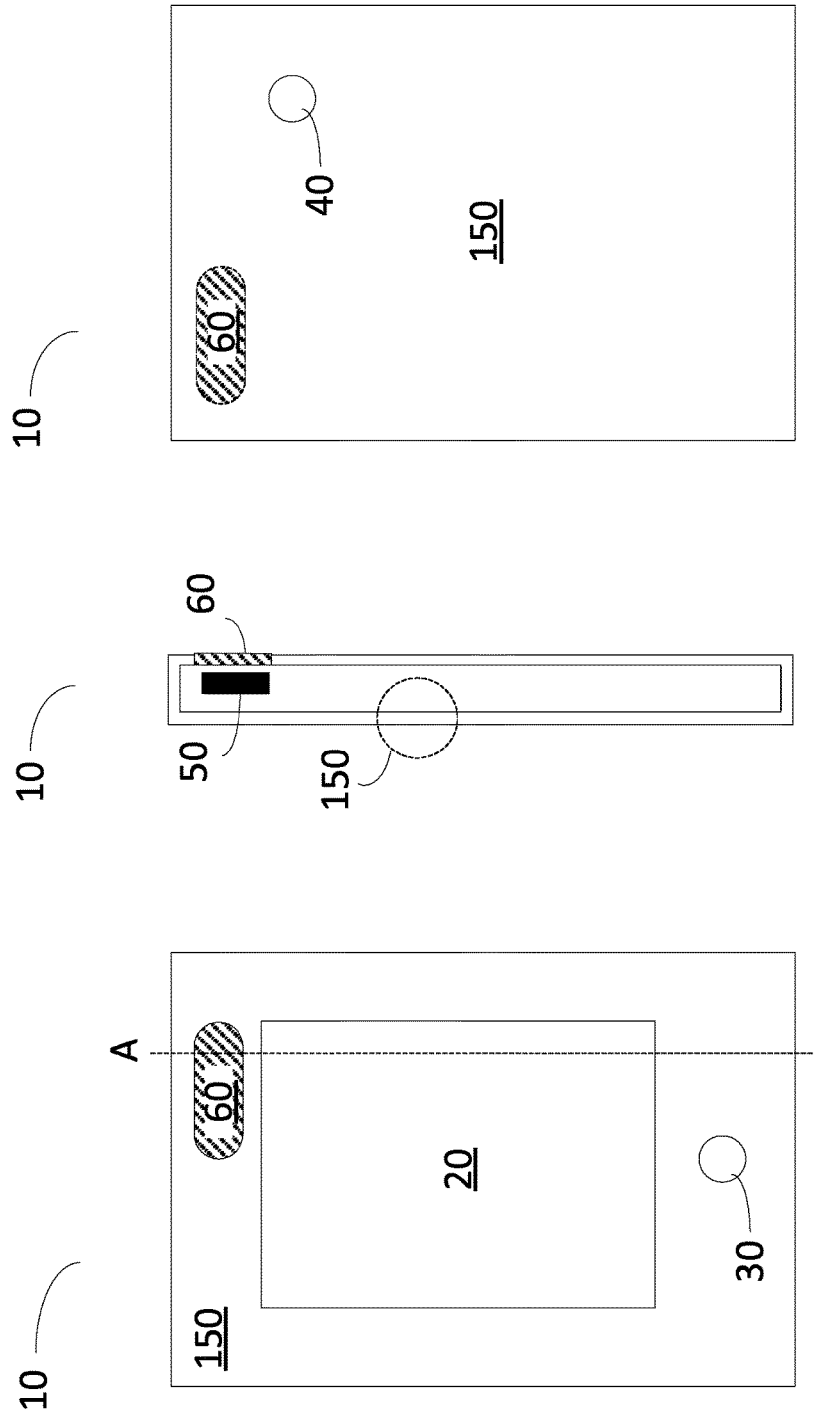

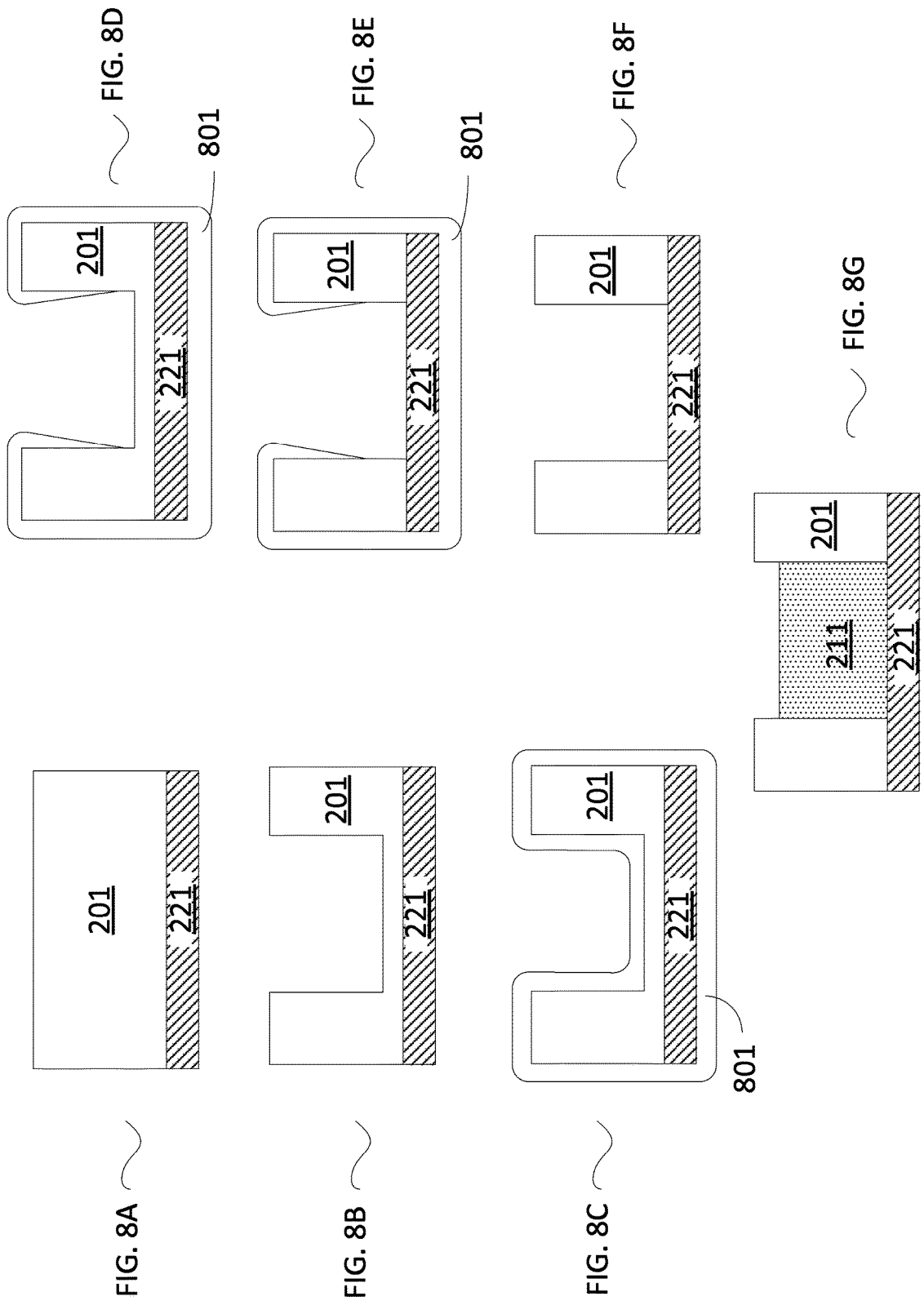

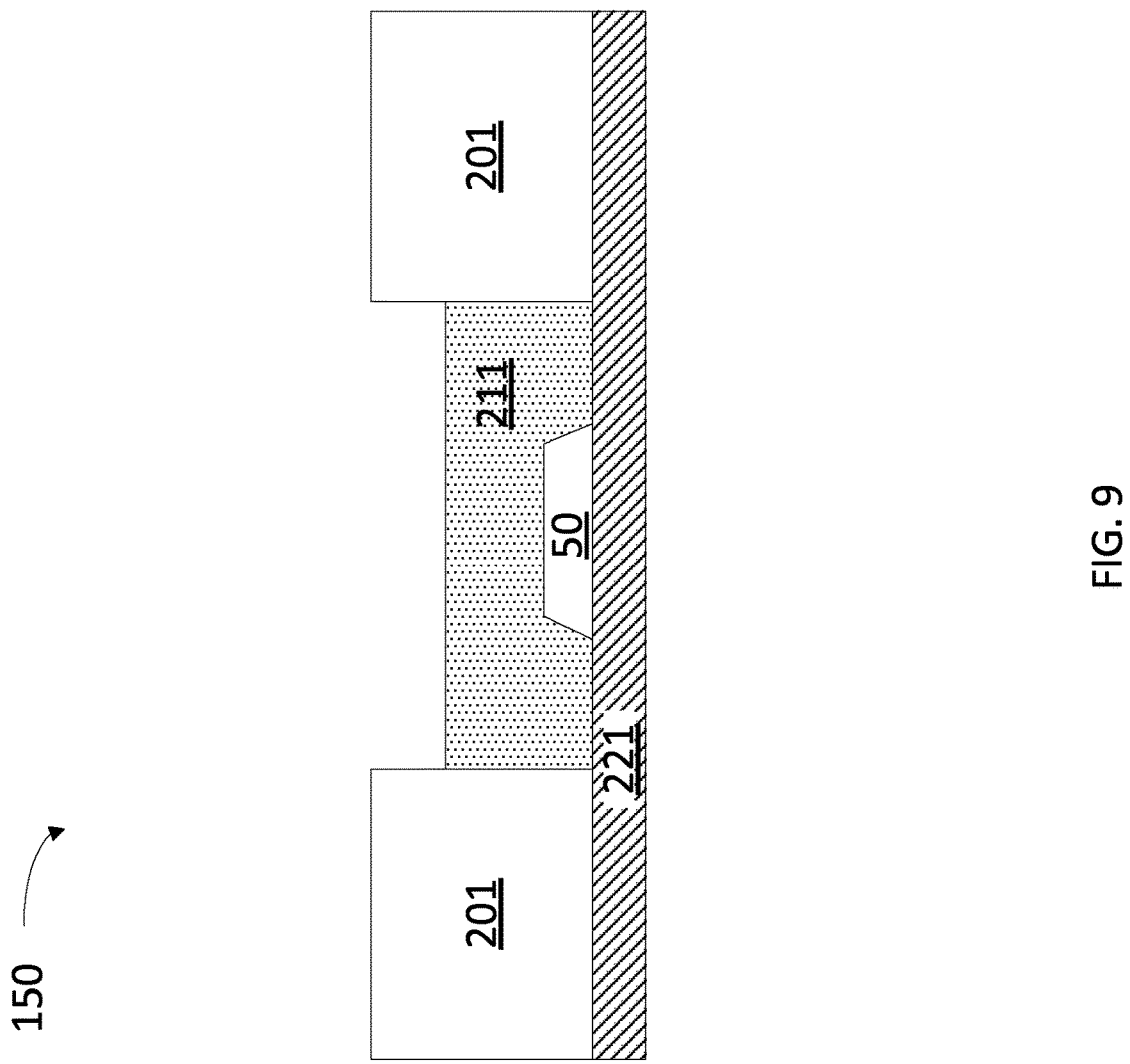

ANTENNA WINDOW AND ANTENNA PATTERN FOR ELECTRONIC DEVICES AND METHODS OF MANUFACTURING THE SAME

CROSS-REFERENCE TO RELATED APPLICATIONS

This application is a continuation of U.S. patent application Ser. No. 13/973,939, filed Aug. 22, 2013, entitled ANTENNA WINDOW AND ANTENNA PATTERN FOR ELECTRONIC DEVICES AND METHODS OF MANUFACTURING THE SAME, which claims the benefit of U.S. Provisional Patent Application No. 61/832,760, filed Jun. 7, 2013, entitled ANTENNA WINDOW AND ANTENNA PATTERN FOR ELECTRONIC DEVICES AND METHODS OF MANUFACTURING THE SAME, both of which are incorporated by reference herein in their entireties.

FIELD OF THE DESCRIBED EMBODIMENTS

The described embodiments relate generally to housings for electronic devices adapted to include radio-frequency (RF) antennas. More particularly, embodiments disclosed herein relate to metallic housings for portable electronic devices adapted to include radio-frequency antennas.

BACKGROUND

Antenna architecture is an integral part of a consumer electronics product. Housings and structural components are often made from conductive metal, which can serve as a ground for an antenna. However, antennas require nonconductive regions or other isolation to provide a good radiation pattern and signal strength. To solve this problem conventional designs include a plastic antenna window or a plastic split in a housing to separate the conductive metal. However, this approach breaks the consistent visual profile of the device, deteriorating the cosmetic appeal of the metal surface. Also, replacing metallic portions of the housing with softer materials weakens the underlying metal and uses device volume to fasten the parts together.

Therefore, what is desired is a housing for an electronic device that integrates antenna designs in a manner that is visually consistent with the cosmetic appeal of the device and that provides structural support for the device and functional support for the antenna.

SUMMARY OF THE DESCRIBED EMBODIMENTS

In a first embodiment, a housing for an electronic device is provided. The housing may include an aluminum layer enclosing a volume that includes a radio-frequency (RF) antenna, the aluminum layer having a window aligned with the RF antenna. The window includes a non-conductive material filling a gap in the aluminum layer and a thin aluminum oxide layer adjacent to the aluminum layer and to the non-conductive material. The non-conductive material and the thin aluminum oxide layer form an RF-transparent path to allow transmission of substantially all RF radiation through the window.

In a second embodiment, a housing for an electronic device is provided. The housing may include an aluminum layer enclosing a number of electronic circuits. The housing also may also include an oxide layer on an exterior surface of the aluminum layer. The housing may additionally include one or more radio-frequency (RF) antennas. The one or more RF antennas includes an electrically conductive path including a first segment and a second segment. The one or more RF antennas also includes a non-conductive material adjacent to the conductive path, the non-conductive material electrically insulating the first segment of the electrically conductive path from the second segment of the electrically conductive path. The one or more RF antenna additionally includes an RF-transparent material layer adjacent to the hard material layer and to the electrically conductive path. At least one of the first segment and the second segment is part of the aluminum layer.

In a third embodiment, a method of manufacturing a housing for an electronic device is provided. The method may include converting an aluminum layer in the housing to an exterior aluminum oxide layer. The method may also include removing the aluminum layer adjacent to the aluminum oxide layer to form a gap in a window portion of the housing. The method may additionally include filling the gap in the window portion with a non-conductive material. Accordingly, the gap allows transmission of substantially all RF radiation through the window portion.

In yet another embodiment, a method of forming a radio-frequency (RF) transparent window in an aluminum housing for an electronic device is provided. The method may include inserting an RF transparent material into a window opening in the aluminum housing. The method may also include forming a thin aluminum layer on an exterior surface of the aluminum housing and the RF transparent material. The method may further include anodizing the thin aluminum layer to form an aluminum oxide layer so that the aluminum oxide layer is adjacent to the RF transparent material in the window opening, allowing transmission of substantially all RF radiation through the window.

Other aspects and advantages of the invention will become apparent from the following detailed description taken in conjunction with the accompanying drawings which illustrate, by way of example, the principles of the described embodiments.

BRIEF DESCRIPTION OF THE DRAWINGS

The described embodiments may be better understood by reference to the following description and the accompanying drawings. Additionally, advantages of the described embodiments may be better understood by reference to the following description and accompanying drawings. These drawings do not limit any changes in form and detail that may be made to the described embodiments. Any such changes do not depart from the spirit and scope of the described embodiments.

FIGS. 1A-1C illustrate a portable electronic device, according to some embodiments.

FIGS. 2A-2C illustrate steps in a method of forming a housing for an electronic device including a Radio-Frequency (RF) antenna, according to some embodiments.

FIGS. 3A-3C illustrate steps in a method of forming a housing for an electronic device including an RF antenna, according to some embodiments.

FIGS. 4B-4D illustrate steps in a method of forming a housing for an electronic device including an RF antenna, according to some embodiments.

FIGS. 5A-5B illustrate steps in a method of forming a housing for an electronic device including an RF antenna, according to some embodiments.

FIGS. 6A-6C illustrate a portable electronic device, according to some embodiments.

FIGS. 8A-8G illustrate steps in a method of forming a housing for an electronic device including an RF antenna, according to some embodiments.

FIG. 9 illustrates a cross-sectional view of a housing for an electronic device including an RF antenna, according to some embodiments.

In the figures, elements referred to with the same or similar reference numerals include the same or similar structure, use, or procedure, as described in the first instance of occurrence of the reference numeral.

DETAILED DESCRIPTION OF SELECTED EMBODIMENTS

Figure 4A:
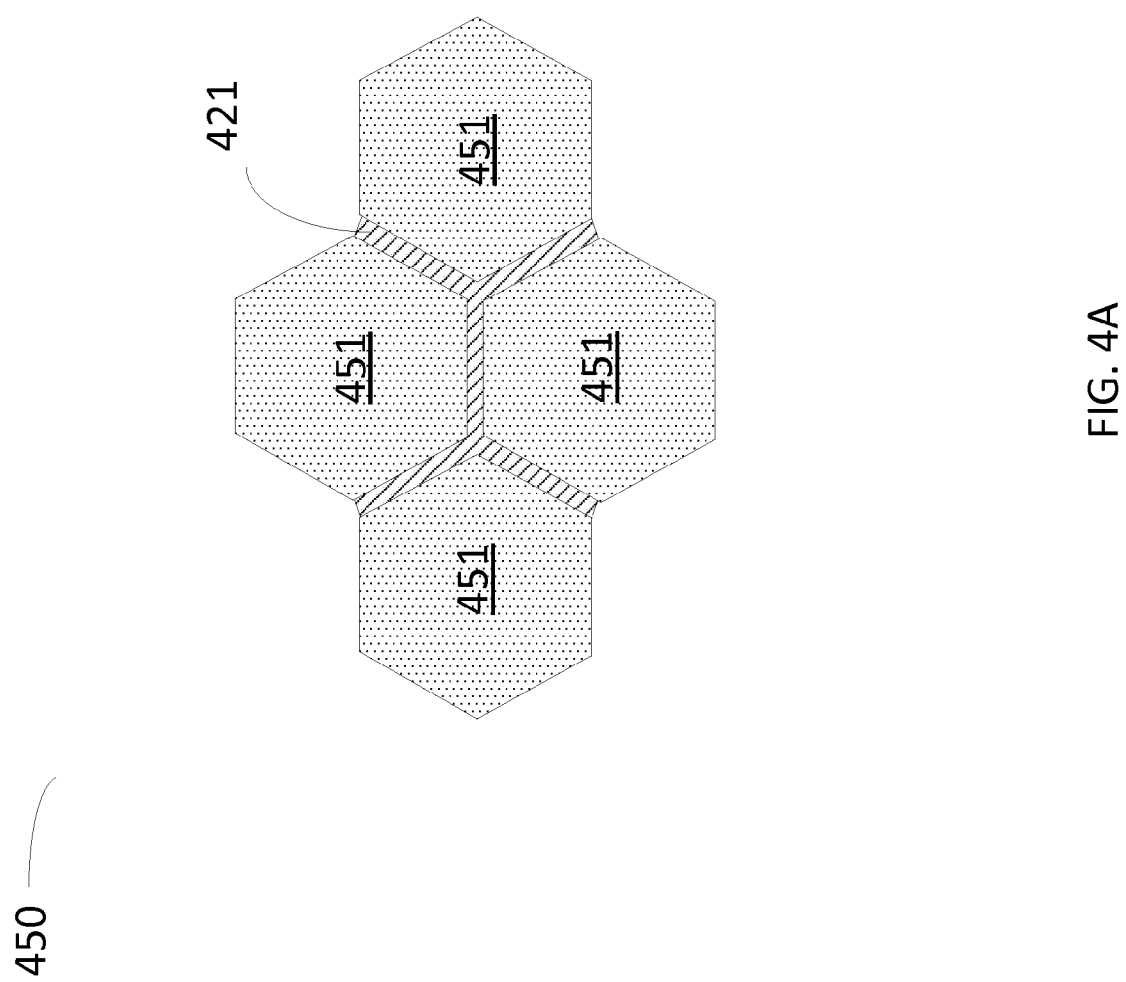
FIG. 4A illustrates a partial plan view of a housing for an electronic device including an RF antenna, according to some embodiments.

Representative applications of methods and apparatus according to the present application are described in this section. These examples are being provided solely to add context and aid in the understanding of the described embodiments. It will thus be apparent to one skilled in the art that the described embodiments may be practiced without some or all of these specific details. In other instances, well known process steps have not been described in detail in order to avoid unnecessarily obscuring the described embodiments. Other applications are possible, such that the following examples should not be taken as limiting.

In the following detailed description, references are made to the accompanying drawings, which form a part of the description and in which are shown, by way of illustration, specific embodiments in accordance with the described embodiments. Although these embodiments are described in sufficient detail to enable one skilled in the art to practice the described embodiments, it is understood that these examples are not limiting; such that other embodiments may be used, and changes may be made without departing from the spirit and scope of the described embodiments.

The various aspects, embodiments, implementations or features of the described embodiments can be used separately or in any combination. Various aspects of the described embodiments can be implemented by software, hardware or a combination of hardware and software. The described embodiments can also be embodied as computer readable code on a computer readable medium for controlling manufacturing operations or as computer readable code on a computer readable medium for controlling a manufacturing line. The computer readable medium is any data storage device that can store data, which can thereafter be read by a computer system. Examples of the computer readable medium include read-only memory, random-access memory, CD-ROMs, HDDs, DVDs, magnetic tape, and optical data storage devices. The computer readable medium can also be distributed over network-coupled computer systems so that the computer readable code is stored and executed in a distributed fashion.

Electronic device housings consistent with the present disclosure include a hard, cosmetic anodized surface of aluminum. The anodized surface is nonconductive and thus is transparent to radio-frequency (RF) electronic radiation. In some embodiments, the anodized surface may have a thickness on the order of 10 microns (1 micron=1 $\mu$m=$10^{-6}$ m). By adjusting the anodization parameters the anodization depth can be made to have a thickness of over 100 microns. A number of design techniques (outlined in the attachment) can be used to create a continuous, anodized, cosmetic aluminum surface that is selectively conductive in certain portions and non-conductive in other portions. This allows an antenna window or even an antenna to be patterned directly into the housing. Such electronic device housing improves product cosmetics, and reduces the size of the device.

Antenna windows in aluminum enclosures are challenging. Prior solutions include splits in housings and plastic covered antenna windows. Our proposed solution is to use aluminum oxide as the antenna window. Aluminum oxide is non-conductive and transparent to RF. Aluminum oxide is created during the process of anodization. The thickness can be nominally up to 100 um thick or higher by careful adjustment of the anodization parameters. The process, as outlined in the attached, includes anodization of the exterior housing and then etching away on the interior of the housing antenna windows at desired locations for antenna windows, followed by filling in the etched portions with plastic, paint, or other suitable material to maintain structural integrity. The aluminum oxide can be substantially clear or transparent, allowing the filling material to show through. The resulting housing is cosmetically pleasing and without cracks or apparent plastic portions.

Accordingly, embodiments consistent with the present disclosure provide a housing for an electronic device integrating antenna designs in a manner that is visually consistent with the cosmetic appeal of the device. In some embodiments, an electronic device housing provides structural support for the device and functional support for the antenna integrated in the device. In some embodiments, a housing for an electronic device includes a window for an antenna, the window providing RF-transparency for the antenna signals while maintaining a consistent visual appeal for the device. Also, the RF-transparent window maintains a structural support for the housing.

FIG. 1A illustrates a plan view of a front face in a portable electronic device 10, according to some embodiments. Portable electronic device 10 includes a housing 150 holding a display cover 20 and having a sensor aperture 30. Sensor aperture 30 may Portable electronic device 10 also includes at least an RF antenna 50 which may be integrated into housing 150. In some embodiments RF antenna 50 may be in the interior side of housing 150. In that regard, portable electronic device 10 may include multiple RF antennas, some of which may be integrated into housing 150, and others may be included in the interior side of housing 150. While RF antenna 50 in FIG. 1A is shown as a coil wrapping around display cover 20, other configurations are possible.

Housing 150 may include an RF-transparent layer 100 over a hard material substrate 110. In some embodiments, RF-transparent layer 100 may be an oxide layer formed from hard material substrate 110. For example, hard material layer 110 may include an aluminum layer and RF-transparent layer 100 may be aluminum oxide formed from converting a portion of the aluminum layer. Accordingly, RF-transparent layer may be an exterior layer of housing 150, and hard material layer 110 may be an interior layer of housing 150.

FIG. 1B illustrates a cross-sectional view of portable electronic device 10, according to some embodiments. The cross-section in FIG. 1B is taken along segment A-A' (cf. FIG. 1A). FIG. 1B illustrates a configuration where RF antenna 50 is integrated into housing 150. While RF antenna 50 includes a conductive portion, the antenna is configured to include portions of RF-transparent layer 120 separating different segments of RF antenna 50. As mentioned above, in some embodiments hard material substrate 110 includes a metal. Thus, hard material layer 110 provides structural support to the electronic device, and also a ground connection for RF antenna 50, in some embodiments. RF-transparent layer 100 may include an electrically resistive material (e.g., aluminum oxide) effectively isolating segments of RF antenna 50 from each other and from other conductive portions of housing 150 (e.g., aluminum layer 110). FIG. 1C illustrates a plan view of a back face in portable electronic device 10, according to some embodiments. Accordingly, in some embodiments a cross section of housing 150 as shown in FIG. 1B may include no conductive material, such as aluminum (e.g., layer 110) in certain portions of housing 150 (e.g., layers 120). Such embodiments enable antenna 50 to be integrated within housing 150 as the non-conductive material in layer 120 is adjacent to the conductive path in antenna 50. The non-conductive material in layer 120 electrically insulates a first segment in antenna 50 from a second segment in the conductive path of antenna 50. FIG. 1C illustrates a sensor aperture 40 which may be configured to allow a camera to receive visible light from outside of housing 150. In some embodiments aperture 40 may be configured to allow an audio device to transmit or receive acoustic signals to and from outside housing 150.

FIGS. 2A-2C illustrate steps in a method of forming housing 150 for electronic device 10 including Radio-Frequency (RF) antenna 50, according to some embodiments. FIG. 2A illustrates a step of placing a non-conductive material 211 in a hard material layer 201 forming housing 150. Hard material layer 201 may include an electrically conductive material such as a metal (e.g., aluminum). Non-conductive material 211 may be a plastic, a ceramic material, or glass. In some embodiments, non-conductive material 211 may include a thermosetting polymer, an epoxy, or some other glue including a curable resin. The step illustrated in FIG. 2A may include forming a gap in hard material layer 201 and molding plastic material 211 inside the gap. Accordingly, the gap may have the profile of an antenna window, and be formed in a portion of housing 150 proximate or adjacent to RF antenna 50. FIG. 2B illustrates a step of coating a thin layer of hard material 205 on a side of housing 150 overlapping layers 201 and non-conductive material 211. Layer 205 may include the same material as layer 201. For example, if layer 201 is aluminum, layer 205 may be formed by coating a thin aluminum layer on the side of housing 150, as illustrated in FIG. 2B. The step in FIG. 2B may include Physical Vapor Deposition (PVD) of a metal to form layer 205. Examples of PVD may include sputtering and other procedures known in the art. Accordingly, the step in FIG. 2B may include metallization of a ceramics substrate by steps including ion vapor deposition, chemical vapor deposition (CVD), cathodic arc deposition, plasma spray, and others known in the art. FIG. 2C illustrates a step of oxidizing the thin layer of hard material 205 to form a thin RF-transparent layer 221. In some embodiments, thin RF-transparent layer 211 includes an aluminum oxide layer formed by anodization of thin aluminum layer 205. RF-transparent layer 211 can include metal, just not solid bulk metal or alloy that will block RF transmission. As a result of the steps illustrates in FIGS. 2A-2C, a portion of housing 150 has a cross-section such that an RF-transparent path is formed from an exterior side of housing 150 to an interior side of housing 150.

FIGS. 3A-3C illustrate steps in a method of forming housing 150 for electronic device 10 including antenna 50, according to some embodiments. FIG. 3A illustrates a step providing a layer of hard material 201 (cf. FIGS. 2A-2C, above). FIG. 3B illustrates a step of forming RF-transparent layer 221 adjacent to layer 201 (cf. FIG. 2C). Accordingly, the step in FIG. 3B may include anodizing an aluminum layer 201 to form aluminum oxide layer 221 with a preselected thickness. In some embodiments, the thickness of aluminum oxide layer 221 may be about 12 µm. Such an aluminum oxide layer may result from 'consuming' an approximately 5 µm to 6 µm aluminum layer through anodization. FIG. 3C illustrates a step of forming a non-conductive layer 231 in a portion of hard material layer 201. The step in FIG. 3C may include a 'hard' anodization process to form a thick aluminum oxide layer 231 having a similar thickness as hard material layer 201. For example, in embodiments where hard material layer 201 includes aluminum, the step in FIG. 3C may include using Plasma Electrolytic Oxidation (PEO) to produce a thick layer of alumina (aluminum oxide in crystalline form), also known as sapphire, as non-conductive layer 231. In some embodiments, the step in FIG. 3C may include use of a mask overlapping portions of hard material layer 201 so that layer 231 separates portions of hard material layer 201, prior to anodizing layer 201. Accordingly, layer 231 may be thicker than layer 221. In some embodiments, layer 231 may be up to 50 µm thick, or even more. Some embodiments consistent with the present disclosure may form a thinner aluminum oxide layer 221 on the exterior portion of housing 150, and a thicker aluminum oxide layer 231 on the interior portion of housing 150. Thus, a thinner aluminum oxide layer 221 may be as layer 100 covering all or almost all of the exterior side of housing 150, and a thicker aluminum oxide layer 231 may cover selected portions of the interior side of housing 150 (e.g., layer 120, cf. FIGS. 1A-1C).

FIG. 4A illustrates a partial plan view of a housing 450 for electronic device 10 including RF antenna 50, according to some embodiments. Housing 450 may include a honeycomb configuration where islands 451 made of hard material 201 are isolated from one another by channels 421. Islands 451 may include a conductive material such as aluminum, and channels 421 may include a non-conductive material (e.g., non-conductive material 211, cf. FIG. 2C). FIG. 4A illustrates a honeycomb structure having similar hexagonally shaped islands 451 adjacent to one another. The honeycomb structure can provide stiffness to RF antenna 50 and can provide areas that are sufficiently thin so as to be fully anodized to RF transparent material. While this is an exemplary embodiment, one of ordinary skill would recognize that islands 451 may have any shape. Furthermore, islands 451 may have different shape and size from one another.

FIGS. 4B-D illustrate steps in a method of forming housing 450 for electronic device 10 including RF antenna

50, according to some embodiments. FIG. 4B illustrates a step of forming micro perforations 420 in a hard material layer 201 (cf. FIGS. 2A-2C and FIGS. 3A-3C). Micro perforations 420 can be used to reduce the thickness of hard material layer 201 in areas of micro perforations 420 while maintaining its stiffness. In embodiments where hard material layer 201 includes aluminum, the micro perforations 420 goes through the aluminum and through an aluminum oxide layer adjacent to the aluminum. Micro perforations 420 may be formed by laser machining of aluminum in hard material layer 201. FIG. 4C illustrates a step of forming non-conductive layer 231 from portions of hard material layer 201. Accordingly, the step in FIG. 4C may include selectively anodizing the aluminum in hard material layer 201 to form areas of aluminum oxide, which are RF transparent. In some embodiments, anodizing forms an aluminum oxide layer having a thickness of between about 5 to 300 microns. In particular, aluminum oxide can be formed at micro perforations 420 where the aluminum is very thin. Since the aluminum is thin at micro perforations 420, these regions can have cross sections that are fully anodized to aluminum oxide, thereby creating areas within RF antenna 50 that are RF transparent. The step in FIG. 4C may include using a mask to cover a portion 461 of hard material 201. Portion 461 may form an island of aluminum, a metal, or some other conducting material surrounded by non-conductive layer 231. FIG. 4D illustrates a step of forming a support layer 471 on a side of housing 150. Support layer 471 provides structural integrity and stiffness to housing 150. In some embodiments, support layer 471 may include a fiberglass coating, or a thin layer of glass or plastic. It is desirable that support layer 471 be made of a non-conducting material so as not to compromise the operation of an RF antenna integrated in housing 150. FIG. 4D also illustrates portions 421 and 451 of housing 450 (cf. FIG. 4A).

FIGS. 5A-5B illustrate steps in a method of forming housing 450 for electronic device 10 including RF antenna 50, according to some embodiments. FIG. 5A illustrates a step similar to the step illustrated in FIG. 4B. FIG. 5B illustrates a step of forming a non-conductive layer 231 from portions of hard material layer 201, and forming an RF-transparent layer 221 on a side of housing 150, overlapping non-conductive layer 231 and portion 461.

FIGS. 6A-6C illustrate a portable electronic device 10 including an antenna window 60, according to some embodiments. FIG. 6A illustrates a plan view of a front face in portable electronic device 10 including antenna window 60, according to some embodiments. FIG. 6A includes display cover 20 and sensor aperture 30, as described in detail above (cf. FIG. 1A). FIG. 6B illustrates a cross-sectional view of portable electronic device 10 including antenna window 60, according to some embodiments. Antenna window 60 is placed in apportion of housing 150 proximal to RF antenna 50. In some embodiments antenna window 60 may be adjacent to RF antenna 50. FIG. 6C illustrates a plan view of a back face in portable electronic device 10 including antenna window 60, according to some embodiments. FIG. 6C also includes sensor aperture 40, as described in detail above (cf. FIG. 1C). As mentioned above in reference to FIGS. 1A-1C, embodiments consistent with the present disclosure may include multiple RF antennas located in different areas in portable electronic device 10. For example, an RF antenna may be integrated in housing 150 (cf. FIG. 1A), and another RF-antenna may be in the interior side of housing 150, adjacent to antenna window 60 (cf. FIG. 6B).

Figure 7C:
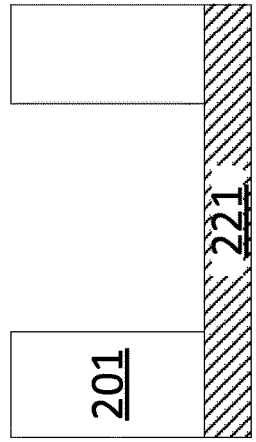
FIGS. 7A-7D illustrate steps in a method of forming a housing for an electronic device including an RF antenna, according to some embodiments.
Figure 7D:
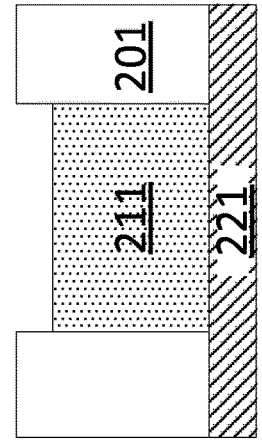
Figure 7A:
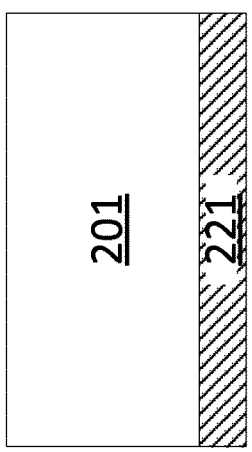
Figure 7B:
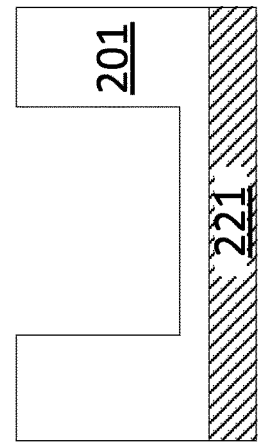

FIGS. 7A-7D illustrate steps in a method of forming housing 150 for electronic device 10 including RF antenna 50, according to some embodiments. FIG. 7A illustrates a step of forming an RF-transparent layer 221 adjacent to a hard material layer 201. The geometry of the cavity can be in the form of a pocket, trench, or any suitable shape that does not break the plane of layer 221. FIG. 7B illustrates a step of forming a cavity in hard material layer 201. The step in FIG. 7B may include machining the cavity, or etching away a portion of material in layer 201 to form the cavity. FIG. 7C illustrates a step of removing a thin residual of material in layer 201 adjacent to layer 221 in the cavity. The cavity can be formed by laser ablation, chemical etch, or other suitable technique as recognized by a person of skill in the art. FIG. 7D illustrates a step of filling the cavity in layer 201 with non-conductive material 211.

FIGS. 8A-8G illustrate steps in a method of forming housing 150 for electronic device 10 including RF antenna 60, according to some embodiments. FIG. 8A illustrates a step similar to the step illustrated in FIG. 7A. FIG. 8B illustrates a step similar to step 7B illustrated in FIG. 7B. FIG. 8C illustrates a step of forming a masking layer 801 around layers 201 and 221, including the cavity formed in the step illustrated in FIG. 8B. FIG. 8D illustrates a step of selectively removing masking layer 801 in an area overlapping a residual thickness of material 201 adjacent to layer 221 in the cavity formed in the step illustrated in FIG. 8B. The step illustrated in FIG. 8D may include etching away masking layer 801 in the selected portion. FIG. 8E illustrates a step of removing the hard material 201 left unmasked in step 8D. FIG. 8F illustrates a step of removing residual masking layer 801. FIG. 8G illustrates a step of filling the cavity with non-conductive material 211.

Accordingly, in embodiments of housing 150 for electronic device 10 where the hard material layer 110 forming the housing is aluminum, some embodiments of an RF-antenna window may include removing all aluminum material in the window area (cf. FIGS. 7D and 8E). Such configuration enhances the RF-transparency of the window, as aluminum layers of even a few nm thick have a non-zero absorbance in the RF frequency spectrum.

FIG. 9 illustrates a cross-sectional view of housing 150 for electronic device 10 including RF antenna 50, according to some embodiments. Accordingly, FIG. 9 illustrates hard material layer 201, RF-transparent layer 221, and non-conductive layer 211 in a gap of layer 201. Non-conductive layer 211 includes RF antenna 50. In some embodiments, RF antenna 50 includes a strip of conductive material (e.g., aluminum) adjacent to RF-transparent layer 221.

Figure 10:
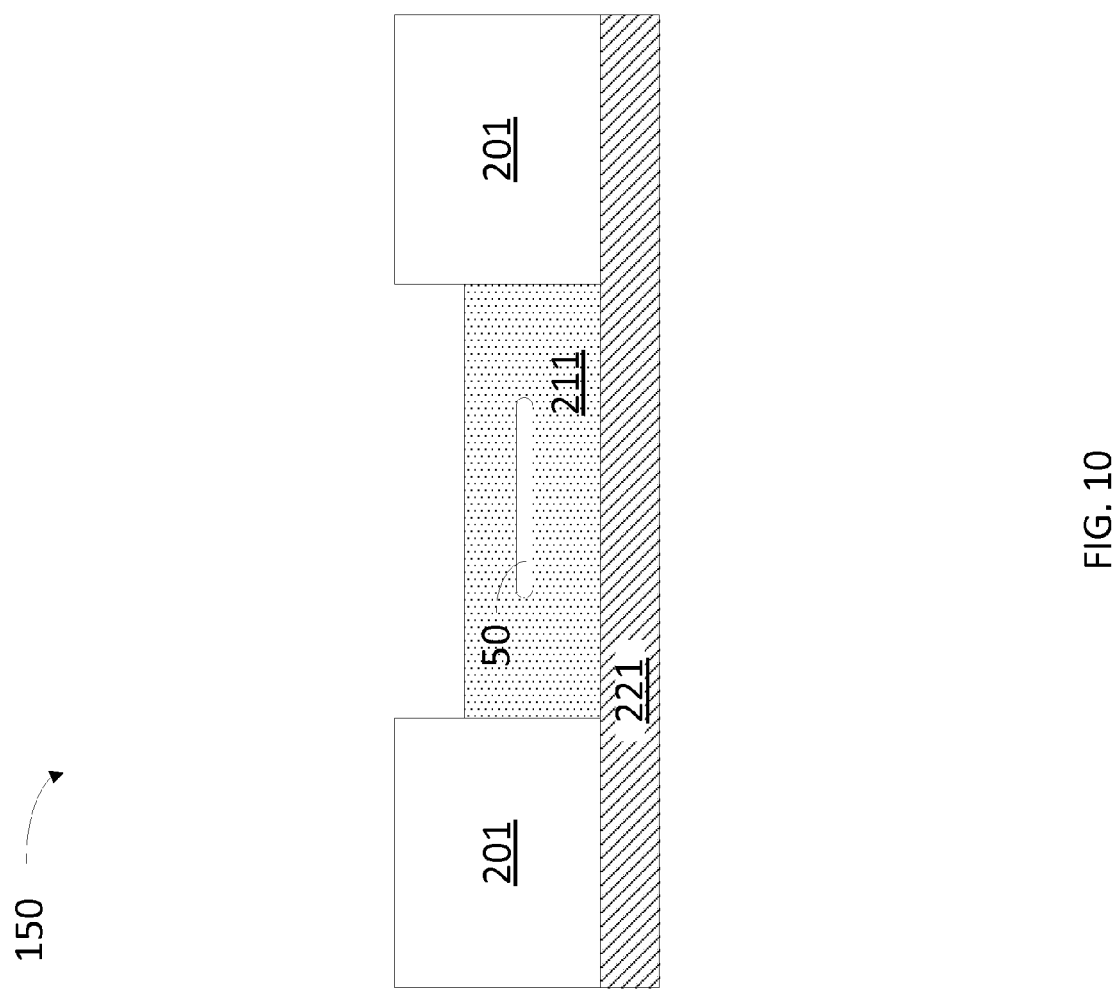
FIG. 10 illustrates a cross-sectional view of a housing for an electronic device including an RF antenna, according to some embodiments.

FIG. 10 illustrates a cross-sectional view of housing 150 for electronic device 10 including RF antenna 50, according to some embodiments. Accordingly, FIG. 10 illustrates hard material layer 201, RF-transparent layer 221, and non-conductive layer 211 in a gap of layer 201. Non-conductive layer 211 includes RF antenna 50. In some embodiments, RF antenna 50 includes a strip of conductive material (e.g., aluminum) embedded within non-conductive layer 211.

Figure 11:
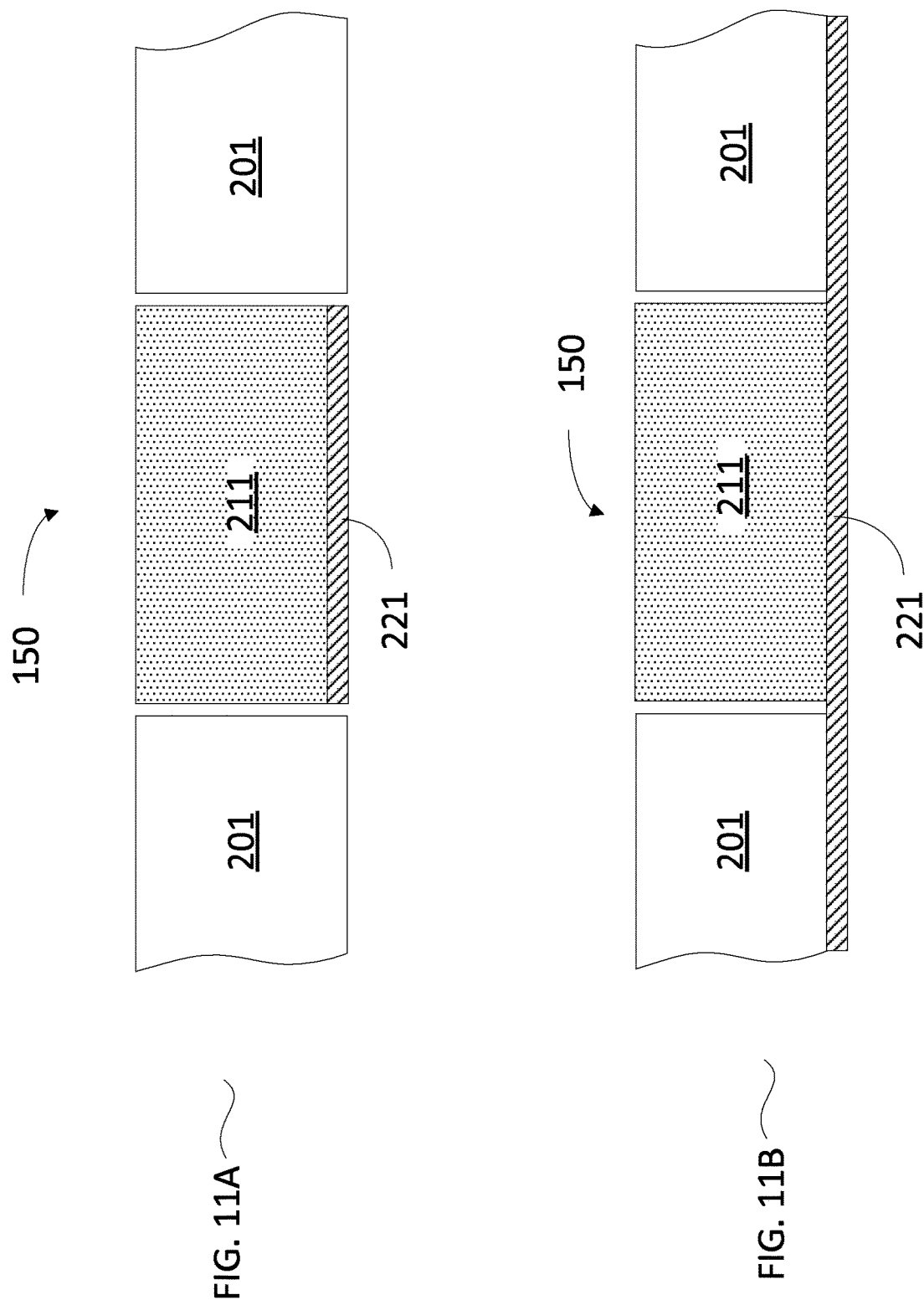
FIG. 11A-11B illustrate steps in a method of forming a housing for an electronic device including an RF antenna, according to some embodiments.

FIG. 11A-11B illustrate steps in a method of forming housing 150 for electronic device 10 including RF antenna 50, according to some embodiments. FIG. 11A illustrates a step of forming a gap in a hard material layer 201. The step in FIG. 11A also includes placing a block including RF-transparent layer 221 adjacent to non-conductive layer 211 in the gap formed in layer 201. FIG. 11B illustrates a step of extending RF-transparent layer 221 across the gap, overlapping hard material layer 201.

Figure 12:
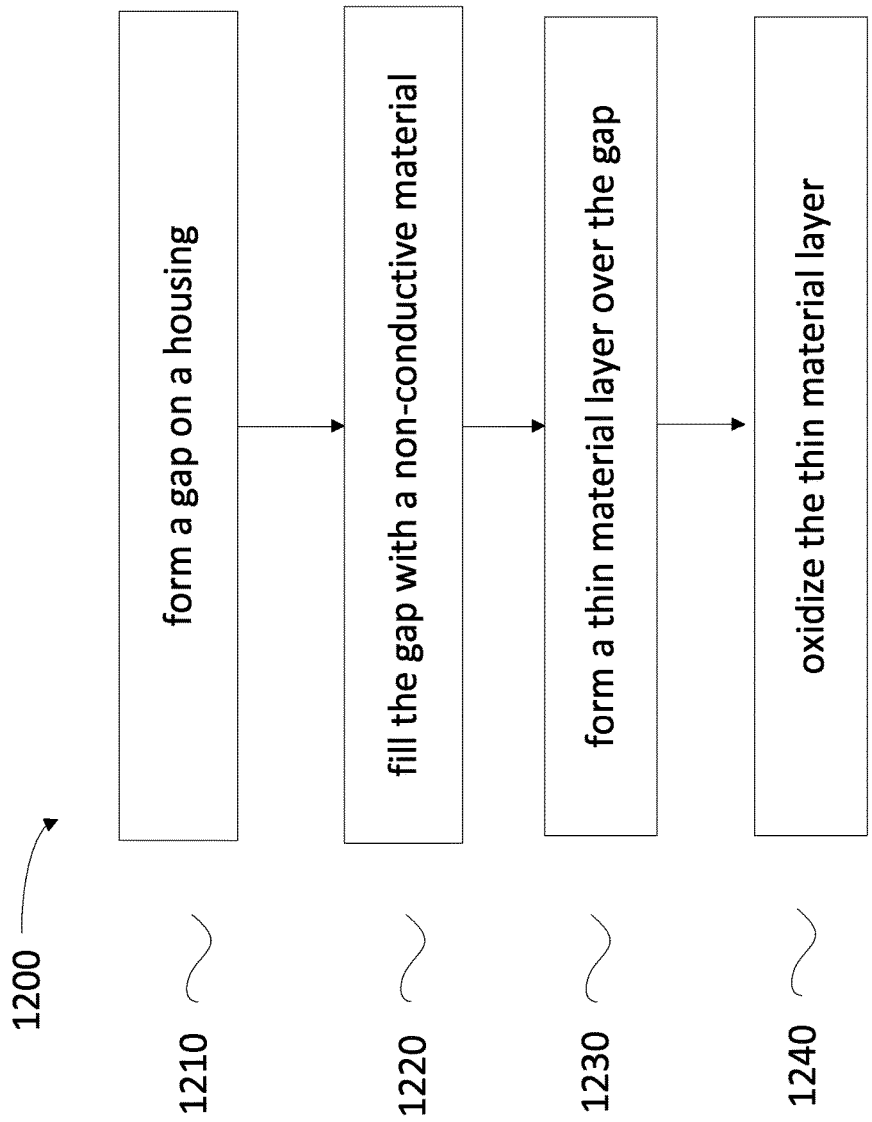
FIG. 12 illustrates a flow chart with steps in a method of forming a housing for an electronic device including an RF antenna, according to some embodiments.

FIG. 12 illustrates a flow chart with steps in a method 1200 of forming housing 150 for electronic device 10 including RF antenna 50, according to some embodiments. Step 1210 includes forming a gap on the housing. The housing may include a hard material layer made of aluminum (e.g., layer 110, cf. FIG. 1B). Accordingly, step 1210 may be as described in detail in relation to FIG. 2A. Step 1220 includes filling the gap with a non-conductive material. Accordingly, steps 1210 and 1220 may be included in the steps illustrated in detail in relation to FIG. 2A. Step 1230 includes forming a thin material layer over the gap (cf. FIG. 2B). And step 1240 includes oxidizing the thin material layer (cf. FIG. 2C). Accordingly, step 1240 may include forming an RF-transparent layer adjacent to a portion of the hard material layer and the non-conductive material filling the gap in the hard material layer.

Figure 13:
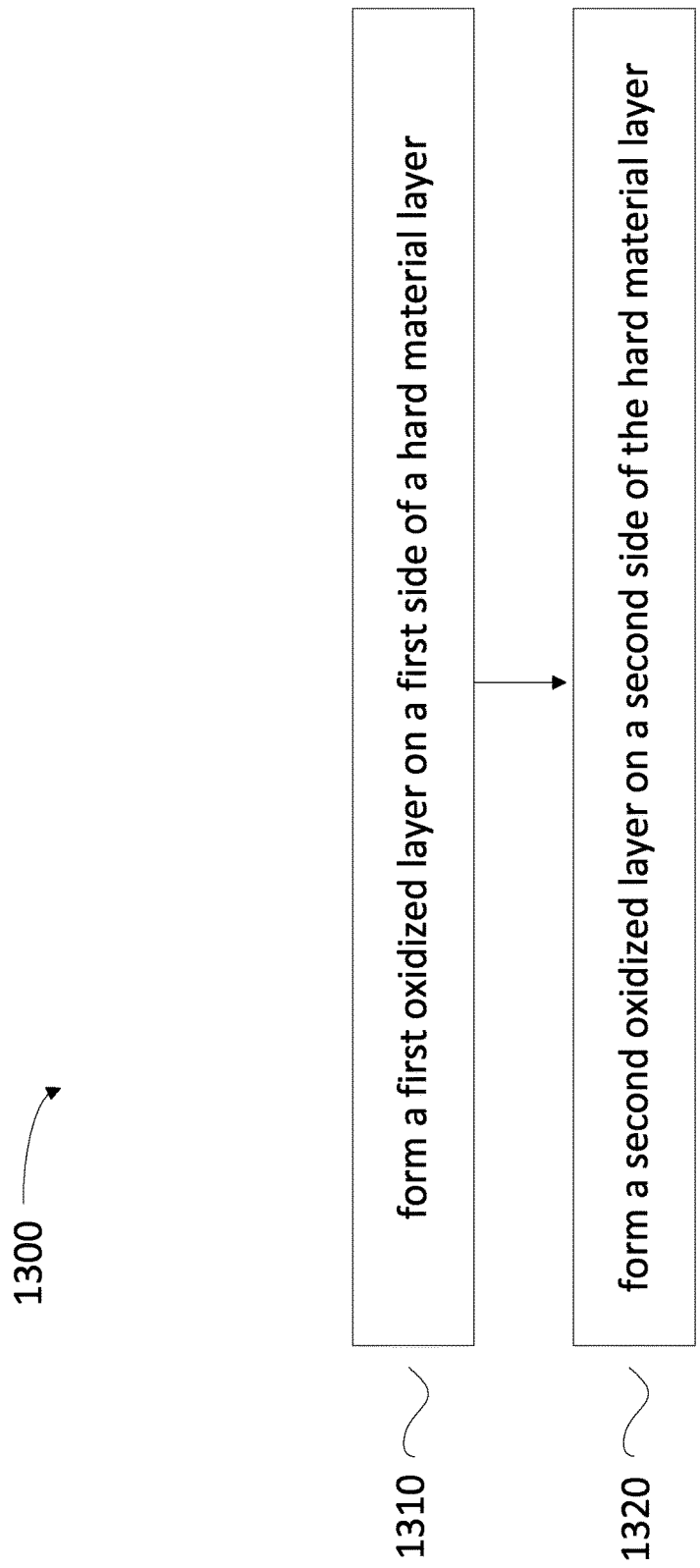
FIG. 13 illustrates a flow chart with steps in a method of forming a housing for an electronic device including an RF antenna, according to some embodiments.

FIG. 13 illustrates a flow chart with steps in a method 1300 of forming housing 150 for electronic device 10 including RF antenna 50, according to some embodiments. Step 1310 includes forming a first oxidized layer on a first side of a hard material layer. In some embodiments, step 1310 may include anodizing an aluminum layer to form a thin RF-transparent layer on one side (e.g., layer 221, cf. FIG. 3B). Step 1320 includes forming a second oxidized layer on a second side of the hard material layer (e.g., layer 231, cf. FIG. 3C).

Figure 14:
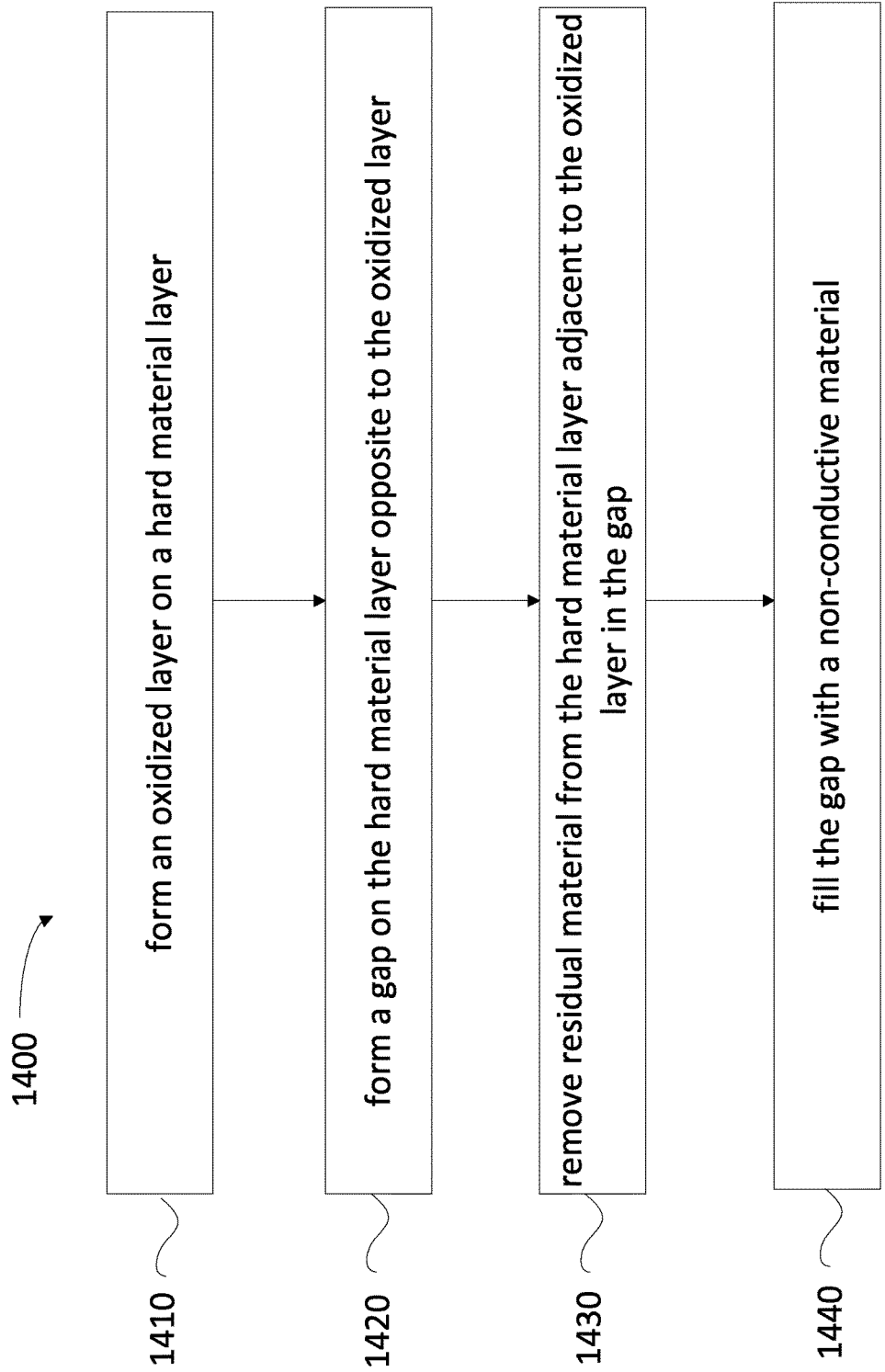
FIG. 14 illustrates a flow chart with steps in a method of forming a housing for an electronic device including an RF antenna, according to some embodiments.

FIG. 14 illustrates a flow chart with steps in a method 1400 of forming housing 150 for electronic device 10 including RF antenna 50, according to some embodiments. Step 1410 includes forming an oxidized layer on a hard material layer. In some embodiments, step 1410 may include anodizing an aluminum layer to form a thin RF-transparent layer (e.g., layer 221, cf. FIGS. 7A and 8A). Step 1420 includes forming a gap on the hard material layer on a side opposite to the oxidized layer (cf. FIGS. 7B and 8B). Step 1430 includes removing residual material from the hard material layer adjacent to the oxidized layer in the gap (cf. FIGS. 7C and 8C-F). Step 1440 includes filling the gap with a non-conductive material (cf. FIGS. 7D and 8G).

Embodiments of antenna windows and methods of manufacturing the same as disclosed herein may also be implemented with other sensors included in electronic device 10. For example, in some embodiments patch 60 may include a touch sensitive pad configured to receive a touch from the user. The touch sensitive pad may be capacitively coupled to an electronic circuit configured to determine touch position and gesture interpretation.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of specific embodiments are presented for purposes of illustration and description. They are not intended to be exhaustive or to limit the described embodiments to the precise forms disclosed. It will be apparent to one of ordinary skill in the art that many modifications and variations are possible in view of the above teachings.

What is claimed is:

1. A housing for an electronic device, comprising:
a metal layer;
a first and a second gap formed through a thickness of the metal layer and arranged to form an electrically isolated segment of the metal layer, wherein the electrically isolated segment forms a radio frequency (RF) antenna;
a non-conductive material filling the first and the second gaps in the metal layer; and
a metal oxide layer formed on an exterior surface of the metal layer and extending across the first and the second gaps and the electrically isolated segment, wherein the metal oxide layer forms an RF-transparent window.

2. The electronic device of claim 1, wherein the non-conductive material is a metal oxide.

3. The electronic device of claim 1, wherein the metal layer is aluminum.

4. The electronic device of claim 1, wherein the non-conductive material comprises a polymer.

5. The electronic device of claim 1, further comprising a third gap formed through the thickness of the metal layer.

6. The electronic device of claim 1, wherein the metal layer comprises aluminum and the metal oxide layer comprises aluminum oxide.

7. A method of manufacturing a housing for an electronic device, the method comprising:
forming a metal layer;
forming a first and a second gap through a thickness of the metal layer to isolate a segment of the metal layer;
filling the first and second gaps with a non-conductive material; and
forming a metal oxide layer on the metal layer, wherein the metal oxide layer extends across the first and the second gaps and the segment.

8. The method of claim 7, wherein the non-conductive material is a metal oxide.

9. The method of claim 7, wherein the metal oxide layer is formed before the first and second gaps.

10. The method of claim 7, wherein forming the first and the second gaps is performed by converting portions of the metal layer to a metal oxide.

11. The method of claim 10, wherein forming the first and the second gaps includes masking a portion of an interior surface of the metal layer and performing a Plasma Electrolytic Oxidation (PEO) at an unmasked portion of an interior surface of the metal layer.

12. The method of claim 7, wherein the filling includes using a material selected from the group consisting of a plastic, a thermosetting polymer, and a resin.

13. The method of claim 7, forming the first and the second gaps includes machining the metal layer, etching away the metal layer, or both.

14. The method of claim 7, wherein forming the first and the second gaps includes forming micro-perforations in an interior side of the metal layer to establish thin wall sections that allow substantially all of the metal layer at the thin wall sections to be anodized.

15. The method of claim 7, further comprising:
forming a third gap in the metal layer.

16. The method of claim 15, wherein one or more RF antennas are formed in the metal layer.

17. The method of claim 7, wherein the metal oxide layer is formed by first depositing an aluminum layer on a surface of the housing by performing a process selected from the group consisting of physical vapor deposition, chemical vapor deposition, ion vapor deposition, cathodic arc deposition, and plasma spray deposition.

* * * * *